United States Patent
Chen et al.

(10) Patent No.: US 6,303,043 B1
(45) Date of Patent: Oct. 16, 2001

(54) METHOD OF FABRICATING PRESERVE LAYER

(75) Inventors: Wei-Shiau Chen, Chin-Men Hsien; Ruoh-Haw Chang, Chiayi Hsien; Shu-Jen Chen, Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/348,407

(22) Filed: Jul. 7, 1999

(51) Int. Cl.$^7$ .................................................. H01L 21/00
(52) U.S. Cl. .................. 216/39; 216/19; 438/424; 438/435; 438/697; 438/954
(58) Field of Search .................... 216/19, 23, 38, 216/39; 438/424, 435, 697, 702, 954; 427/579

(56) References Cited

U.S. PATENT DOCUMENTS

| | | | |
|---|---|---|---|
| 4,990,463 | * 2/1991 | Mori | 437/52 |
| 5,200,358 | * 4/1993 | Bollinger et al. | 437/180 |
| 5,256,587 | * 10/1993 | Jun et al. | 437/52 |
| 5,435,888 | * 7/1995 | Kalnitsky et al. | 216/18 |
| 5,504,021 | * 4/1996 | Hong et al. | 437/42 |
| 5,627,094 | * 5/1997 | Chan et al. | 438/253 |
| 5,631,197 | * 5/1997 | Yu et al. | 438/699 |
| 5,681,425 | * 10/1997 | Chen | 156/643.1 |
| 5,840,619 | * 11/1998 | Hayashide | 428/598 |
| 5,872,043 | * 2/1999 | Chen | 438/424 |
| 5,883,004 | * 3/1999 | Shiu et al. | 438/692 |
| 5,916,820 | * 6/1999 | Okumura et al. | 438/694 |
| 6,008,108 | * 12/1999 | Huang et al. | 438/436 |
| 6,020,230 | * 2/2000 | Wu | 438/222 |
| 6,037,018 | * 3/2000 | Jang et al. | 427/579 |
| 6,051,508 | * 4/2000 | Takase et al. | 438/724 |
| 6,060,370 | * 5/2000 | Hsia et al. | 438/424 |
| 6,060,394 | * 5/2000 | Wu | 438/692 |
| 6,093,618 | * 7/2000 | Chen et al. | 438/400 |
| 6,100,163 | * 8/2000 | Jang et al. | 438/437 |
| 6,110,800 | * 8/2000 | Chou | 438/431 |
| 6,143,625 | * 11/2000 | Chen et al. | 438/435 |
| 6,143,626 | * 11/2000 | Yabu et al. | 438/436 |
| 6,153,537 | * 11/2000 | Bacchetta et al. | 438/763 |
| 6,194,283 | * 2/2001 | Gardner et al. | 438/424 |
| 6,197,661 | * 3/2001 | Mogami et al. | 438/437 |

* cited by examiner

Primary Examiner—Frankie L. Stinson
Assistant Examiner—Jiri F. Smetana
(74) Attorney, Agent, or Firm—Thomas, Kayden, Horstemeyer & Risley

(57) ABSTRACT

A method of fabricating a preserve layer. A top metallic layer is formed over the substrate. Portions of the metallic layer and the substrate are removed to form a trench. A conformal pad oxide layer is formed over the substrate. A conformal first nitride layer is formed on the pad oxide layer. A spin-on glass layer is formed on the first nitride layer to fill the trench. An etching back step is performed to remove a portion of the spin-on glass layer. The remaining spin-on glass layer fills the trench to the surface of the first nitride layer above the top metallic layer. An oxide layer is formed over the substrate. A second nitride layer is formed on the oxide layer. A preserve layer comprising the pad oxide layer, the first nitride layer, the oxide layer, and the second nitride layer is formed.

15 Claims, 3 Drawing Sheets

METHOD OF FABRICATING PRESERVE LAYER

BACKGROUND OF THE INVENTION

1. Field of the Invention

The present invention relates to a method of forming a preserve layer. More particularly, the present invention relates to a method of fabricating a preserve layer of a reflection micro-LCD.

2. Description of the Related Art

Reflection micro-LCD is operated by applying voltage to a top metallic layer, which is used for controlling a circuit, in order to generate an electrical field for governing the arrangement of liquid crystals. When lights transmit through liquid crystals to the top metallic layer, the top metallic layer reflects the lights to return the lights through the liquid crystals. Since different arrangements of the liquid crystals represent different optical properties, different pictures can be shown on a display.

In order to prevent moisture and scratches from damaging the surface of the top metallic layer, a preserve layer is formed to protect the top metallic layer. However, the structure and the thickness combination of the preserve layer directly affect the reflectivity of the top metallic layer. Thus, the formation of the preserve layer is a decisive step during the fabrication process of the reflection micro-LCD.

FIGS. 1A through 1B are schematic, cross-sectional views showing a conventional method of fabricating a preserve layer.

In FIG. 1A, a dielectric layer 102 is formed on a substrate 100. An adhesion layer 104 and a metallic layer 106 are formed in sequence over the substrate 100. Portions of the top metallic layer 106, the adhesion layer 104, and the dielectric layer 102 are removed to form a trench 108. It is necessary to form the trench 108 completely through the top metallic layer 106, in order to separate the metallic layer 106 into different regions.

In FIG. 1B, a conformal oxide layer 110 is formed over the substrate 100. The thickness of the oxide layer 110 is 5000 angstroms. A nitride layer 112 having a thickness of 7000 angstroms is formed on the oxide layer 110 to fill the trench 108. The oxide layer 110 and the nitride layer 112 together form a preserve layer 114. However, since the preserve layer 114 is particularly thick, the transmissivity of the preserve layer 114 is reduced. Consequently, the reflectivity of the top metallic layer 106 is significantly decreased.

In addition, the conventional method forms the preserve layer 104 with poor planarization. When light transmits through the preserve layer 104, the transmissivity of the preserve layer 114 is reduced due to poor planarization of the preserve layer 114. The reflectivity of the top metallic layer 106 is decreased to 30%. Thus, it is difficult to form a top metallic layer 106 with a high reflectivity.

SUMMARY OF THE INVENTION

The invention provides a method of fabricating a preserve layer. A top metallic layer is formed over the substrate. Portions of the metallic layer and the substrate are removed to form a trench. A conformal pad oxide layer is formed over the substrate. A conformal first nitride layer is formed on the pad oxide layer. A spin-on glass layer is formed on the first nitride layer to fill the trench. An etching back step is performed to remove a portion of the spin-on glass layer. The remaining spin-on glass layer fills the trench to the surface of the first nitride layer above the top metallic layer. An oxide layer is formed over the substrate. A second nitride layer is formed on the oxide layer. A preserve layer comprising the pad oxide layer, the first nitride layer, the oxide layer, and the nitride layer is formed.

The present invention uses the spin-on glass layer to fill the trench. The etching back step is performed with a HF solution to remove the spin-on glass layer outside the trench, so as to obtain a planarized surface. Since the etching selectivity between the first nitride layer and the spin-on glass layer is high, the first nitride layer serves as an etching stop layer during the etching back step.

In comparison with the conventional preserve layer, the preserve layer of the invention is thinner. Thus, the preserve layer protects devices without reducing the reflectivity of the top metallic layer. The reflectivity of the top metallic layer is increased by 90%. The performance of the reflection micro-LCD is thus significantly increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
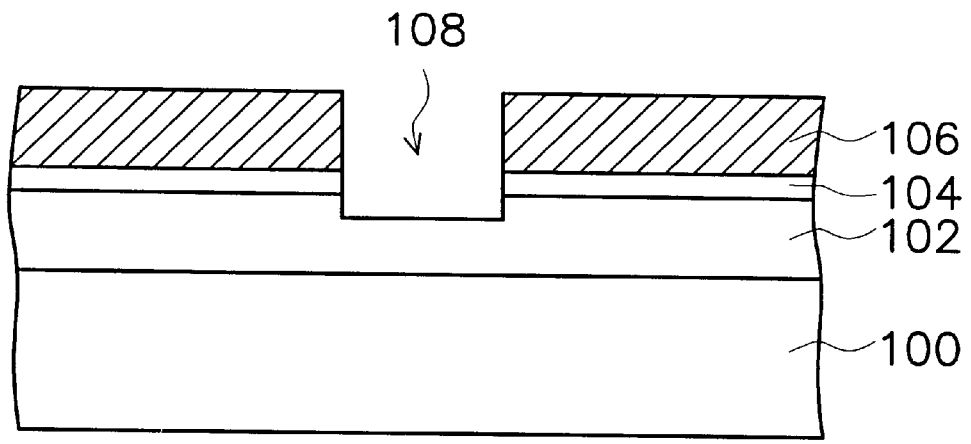
FIGS. 1A through 1B are schematic, cross-sectional views illustrating a conventional method of fabricating a preserve layer.
Figure 1B:
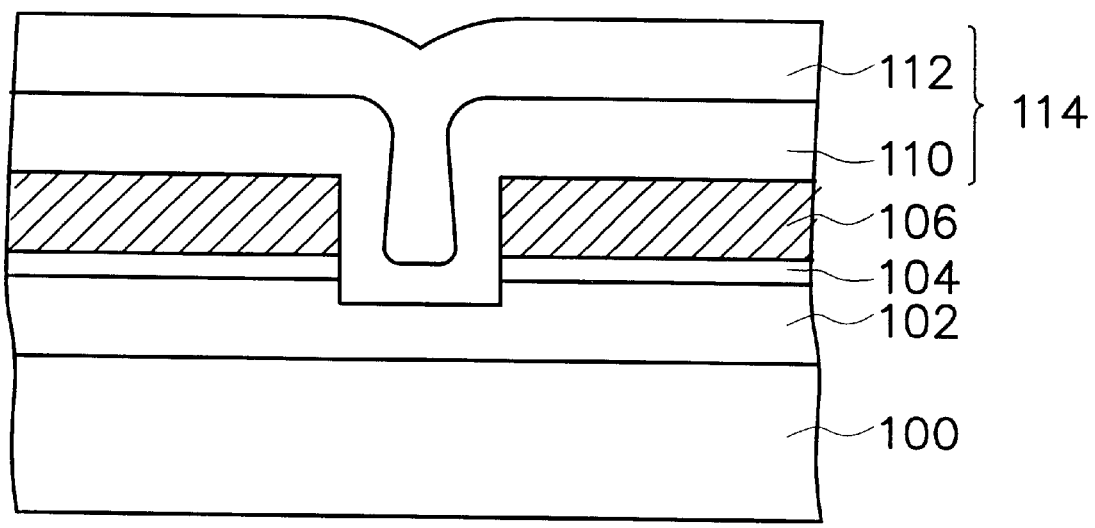

Reference will now be made in detail to the present preferred embodiments of the invention, examples of which are illustrated in the accompanying drawings. Wherever possible, the same reference numbers are used in the drawings and the description to refer to the same or like parts.

Figure 2A:
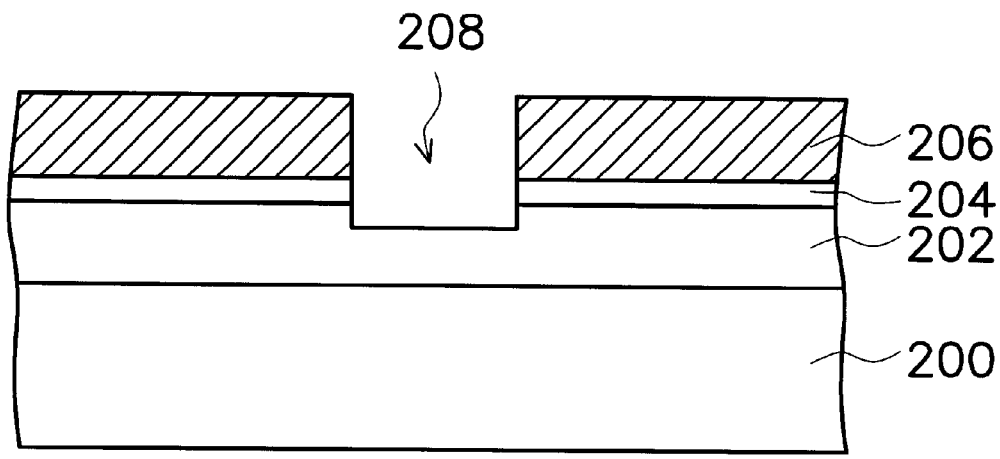
FIGS. 2A through 2D are schematic, cross-sectional views illustrating a method fabricating a preserve layer according to one preferred embodiment of the invention.

In FIG. 2A, a dielectric layer 202 is formed on a substrate 200, which comprises semiconductor devices (not shown) formed thereon. An adhesion layer 204 and a top metallic layer 206 are formed in sequence over the dielectric layer 202. The material of the adhesion layer 204 comprises titanium, titanium nitride, or a combination thereof. The top metallic layer 206 comprises an aluminum layer. The adhesion layer 204 increases the adhesion between the top metallic layer 206 and the dielectric layer 202, such as an oxide layer. Portions of the top metallic layer 206, the adhesion layer 204, and the dielectric layer 202 are removed to form a trench 208. The bottom surface of the trench 208 is lower than the top surface of the dielectric layer 202. The trench 208 separates the top metallic layer 206 into different areas. Thus, the trench 208 needs to be formed through the top metallic layer 206 and the adhesion layer 204, in order to obtain the isolation effect.

Figure 2B:
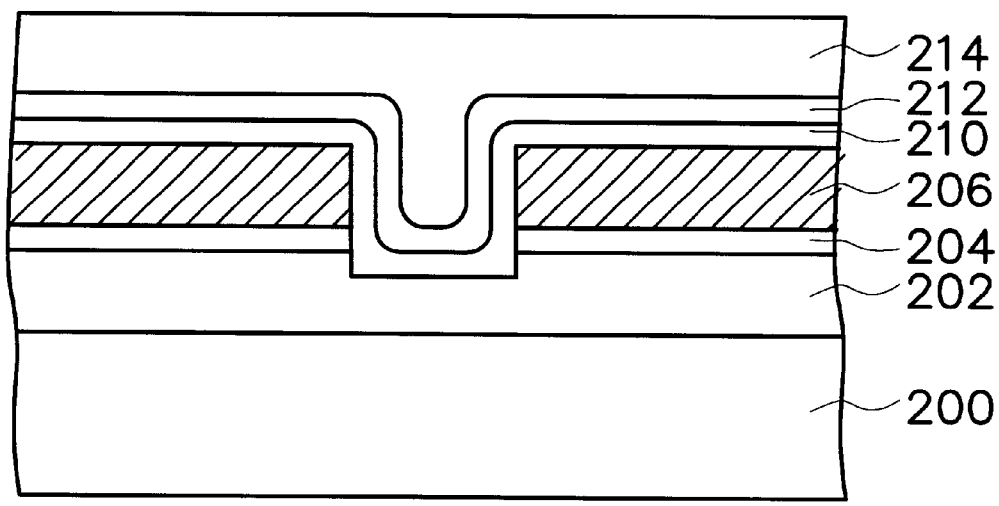

In FIG. 2B, a conformal pad oxide layer 210 is formed over the substrate 200 to cover the surfaces of the trench 208 and the top metallic layer 206. A first nitride layer 212 is formed on the pad oxide layer 210. The pad oxide layer 210 is preferably about 680 angstroms to about 820 angstroms thick. The first nitride layer 212 is preferably about 580 angstroms to about 700 angstroms. The first nitride layer 212 is formed by, for example, chemical vapor deposition (CVD). A spin-on glass layer 214 is formed over the substrate 200 to fill the trench 208 in order to form a planarized surface. The spin-on glass layer 214 is preferably about 4000 angstroms to about 5000 angstroms thick.

Figure 2C:
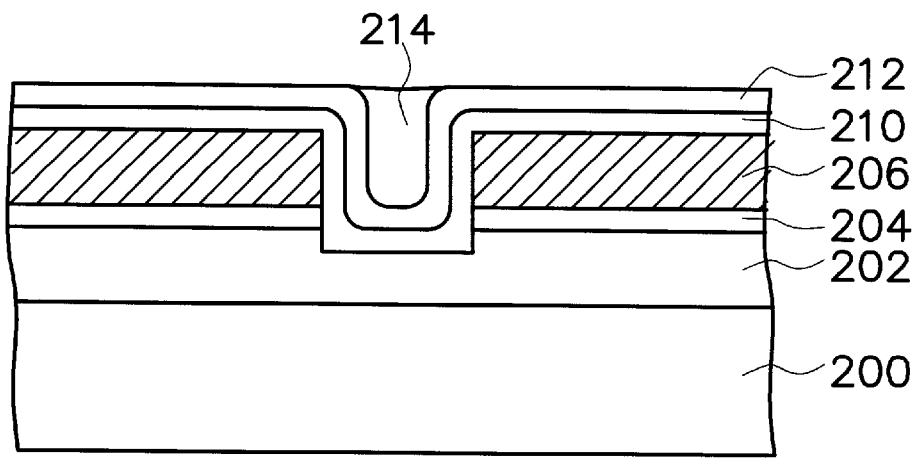

In FIG. 2C, an etching back step is performed. A portion of the spin-on glass layer 214 is removed. A remaining portion of the spin-on glass layer 214 fills the trench 208 to the surface of the first nitride layer 212 the top metallic layer 206. The etching back step can be, for example, performed with a HF solution until the first nitride layer 212 is exposed. In the etching step, the etching selectivity ratio of the first nitride layer 212 to the spin-on glass layer 214 is about 1:50. Specifically, the etching rate for the spin-on glass layer 214 is 50 times higher than the etching rate for the first nitride layer 212. Thus, the first nitride layer 212 is hardly removed in the etching step. The first nitride layer 212 serves as an etching stop layer to prevent the pad oxide layer 210 from being etched. In order to prevent the spin-on glass layer 214 in the trench 208 from being etched, it is necessary to control the etching time of the etching back step.

Figure 2D:
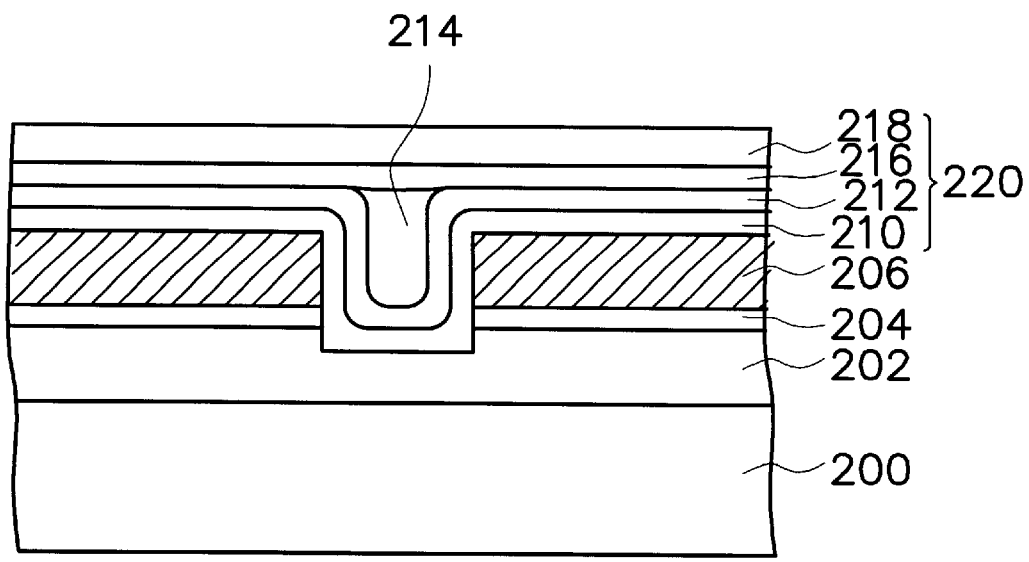

In FIG. 2D, an oxide layer 216 is formed over the substrate 200. A second nitride layer 218 is formed on the oxide layer 216. The pad oxide layer 210, the first nitride layer 212, the oxide layer 216, and the second nitride layer 218 together form a preserve layer 220. The oxide layer 216 is preferably about 760 angstroms to about 920 angstroms thick. The second nitride layer 218 is preferably about 1080 angstroms to about 1320 angstroms thick. The oxide layer 216 can be formed by, for example, plasma-enhanced chemical vapor deposition (PECVD). Since the thickness of the preserve layer 220 greatly affects the reflectivity of the preserve layer 220. It is necessary to obtain a preferred thickness combination and the preferred materials oxide layer 216 and the second nitride layer 218, so as to obtain a preferred reflectivity of the metallic layer 206. With the above-described thickness combination of the preserve layer 220, which comprises the pad oxide layer 210, the first nitride layer 212, the oxide layer 216, and the second nitride layer 218, the reflectivity of the top metallic layer 206 is increased by 90%.

In summary, the invention includes at least the following advantages:

1. The present invention uses a spin-on glass layer to fill the trench. The etching back step is performed with a HF solution to remove the spin-on glass layer outside the trench, so as to obtain a planarized surface. Since the etching selectivity between the first nitride layer and the spin-on glass layer is high, the first nitride layer serves as an etching stop layer during the etching back step.

2. The preserve layer comprises the pad oxide layer, the first nitride layer, the oxide layer, and the second nitride layer. The preserve layer is particularly thin. Thus, the preserve layer protects devices without reducing the reflectivity of the top metallic layer. The reflectivity of the top metallic layer is increased by 90%. The performance of the reflection micro-LCD is thus significantly increased.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a preserve layer comprising:
   forming a top metallic layer over the substrate;
   removing portions of the metallic layer and the substrate to form a trench;
   forming a conformal pad oxide layer over the metallic layer, not completely filling the trench;
   forming a conformal first nitride layer on the pad oxide layer;
   forming a spin-on glass layer on the first nitride layer to fill the trench;
   forming an etched-back surface by performing an etching back step to remove a portion of the spin-on glass layer, wherein a remaining portion of the spin-on glass layer fills the trench to a surface of the first nitride layer above the top metallic layer;
   forming an oxide layer over the etched-back surface; and
   forming a second nitride layer on the oxide layer.

2. The method of claim 1, wherein the top metallic layer comprises an aluminum layer.

3. The method of claim 1, wherein the pad oxide layer is about 680 angstroms to about 820 angstroms thick.

4. The method of claim 1, wherein the first nitride layer is about 580 angstroms to about 700 angstroms thick.

5. The method of claim 1, wherein the oxide layer is about 760 angstroms to about 920 angstroms thick.

6. The method of claim 1, wherein the second nitride layer is about 1080 angstroms to about 1320 angstroms thick.

7. The method of claim 1, wherein the etching back step is performed with a HF solution.

8. The method of claim 7, wherein the etching back step has an etching selectivity ratio of the first nitride layer to the spin-on glass layer of about 1:50.

9. A method of forming a planarized preserve layer, wherein the method is used for a substrate of a reflection micro-LCD display, in which a top metallic layer is formed on the substrate and a trench is formed in the substrate through the top metallic layer, comprising:
   forming a conformal pad oxide layer over the metallic layer, not completely filling the trench;
   forming a conformal first nitride layer on the pad oxide layer;
   forming a spin-on glass layer over the substrate to fill the trench;
   forming an etched-back surface by performing an etching back step to remove a portion of the spin-on glass layer, wherein a remaining portion of the spin-on glass layer fills the trench to the surface of the first nitride layer above the top metallic layer;
   forming an oxide layer over the etched-back surface; and
   forming a second nitride layer to cover the oxide layer.

10. The method of claim 9, wherein the pad oxide layer is about 680 angstroms to about 820 angstroms thick.

11. The method of claim 9, wherein the first nitride layer is about 580 angstroms to about 700 angstroms thick.

12. The method of claim 9, wherein the oxide layer is about 760 angstroms to about 920 angstroms thick.

13. The method of claim 9, wherein the second nitride layer is about 1080 angstroms to about 1320 angstroms.

14. The method of claim 9, wherein the etching back step is performed with a HF solution.

15. The method of claim 14, wherein the etching back step has an etching selectivity ratio of the first nitride layer to the spin-on glass layer of about 1:50.

* * * * *